(12) United States Patent
Nakano

(10) Patent No.: US 8,959,294 B2
(45) Date of Patent: Feb. 17, 2015

(54) STORAGE DEVICE, HOST DEVICE, CIRCUIT BOARD, LIQUID CONTAINER, AND SYSTEM

(75) Inventor: Shuichi Nakano, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 685 days.

(21) Appl. No.: 13/267,799

(22) Filed: Oct. 6, 2011

(65) Prior Publication Data

US 2012/0086979 A1    Apr. 12, 2012

(30) Foreign Application Priority Data

Oct. 8, 2010   (JP) ................. 2010-228904

(51) Int. Cl.
  *G06F 3/12*    (2006.01)
  *G11C 7/10*    (2006.01)
(52) U.S. Cl.
  CPC ...................................... *G11C 7/10* (2013.01)
  USPC ................ 711/154; 711/103; 358/1.15
(58) Field of Classification Search
  CPC ........... G11C 11/4072; G11C 11/5621; G11C 13/0069; G11C 29/028; G11C 7/10; G06F 1/08; G06F 1/24; G06F 1/3203; G06F 13/4239; G06F 13/4291; G06F 1/30; G06F 1/3262; G06F 9/411; G06F 11/26; G06F 11/27; G06F 13/4213; G06F 17/5045; G06F 21/73; G06F 9/06
  USPC .................................. 711/154, 103; 358/1.15
  See application file for complete search history.

(56) References Cited

U.S. PATENT DOCUMENTS

| | | | |
|---|---|---|---|
| 7,321,436 B2 * | 1/2008 | Asauchi ..................... | 358/1.15 |
| 2001/0005457 A1 | 6/2001 | Serizawa | |
| 2007/0126770 A1 * | 6/2007 | Asauchi ..................... | 347/19 |
| 2008/0106757 A1 * | 5/2008 | Asauchi ..................... | 358/1.15 |
| 2009/0089481 A1 * | 4/2009 | Kapoor et al. ............... | 711/103 |
| 2010/0257305 A1 | 10/2010 | Asauchi | |
| 2011/0078336 A1 * | 3/2011 | Radke et al. ................ | 710/10 |

FOREIGN PATENT DOCUMENTS

| | | |
|---|---|---|
| EP | 1 728 638 A2 | 12/2006 |
| JP | 2001-187461 A | 7/2001 |
| JP | 2001-242751 A | 9/2001 |
| JP | 2005-088495 A | 4/2005 |

* cited by examiner

*Primary Examiner* — Hashem Farrokh
(74) *Attorney, Agent, or Firm* — Kilpatrick Townsend & Stockton LLP

(57) ABSTRACT

A storage device includes a control unit performing communication processing for communication with a host device connected to the storage device via a bus, a storage unit to which data from the host device is written, and a storage control unit exerting access control over the storage unit. In a first mode, when receiving a write command and data, the control unit indicates the storage control unit to write the received data to the storage unit, and if the data has been normally written to the storage unit, the control unit returns an acknowledgment to the host device. In a second mode, when receiving the write command and the data, the control unit indicates the storage control unit to write the received data to the storage unit and does not return the acknowledgment to the host device.

19 Claims, 7 Drawing Sheets

STORAGE DEVICE, HOST DEVICE, CIRCUIT BOARD, LIQUID CONTAINER, AND SYSTEM

BACKGROUND

1. Technical Field

The present invention relates to a storage device, a host device, a circuit board, a liquid container, a system, and the like.

2. Related Art

An ink cartridge (a liquid container) used in an ink jet printer often includes a storage device. Information such as ink color and ink consumption quantity is stored in the storage device. The data on the ink consumption quantity is transmitted from a printer main body (host device) to the storage device and then written to a nonvolatile memory or the like included in the storage device. A printer of this type has, however, a problem that the information such as the ink consumption quantity cannot be written to the nonvolatile memory or the like if, for example, power shutdown occurs due to power outage or pulling of a cord out of the wall.

To solve the problem, JP-A-2001-187461 discloses, for example, a technique for writing necessary data to a storage device at a time of power shutdown.

The technique disclosed therein has, however, the following problems. If the number of cartridges to be used increases, overall write processing time is longer and write processing is difficult to complete within a limited power-retaining time.

SUMMARY

An advantage of some aspects of the invention is that it is possible to provide a storage device, a host device, a circuit board, a liquid container, a system, and the like capable of shortening a write processing time.

According to one aspect of the invention, a storage device includes: a control unit performing communication processing for communication with a host device connected to the storage device via a bus; a storage unit, data from the host device being written to the storage unit; and a storage control unit exerting access control over the storage unit, wherein an operation mode of the control unit is a first mode or a second mode, in the first mode, the control unit indicates the storage control unit to write data received from the host device to the storage unit when receiving a write command and the data from the host device, and the control unit returns an acknowledgment to the host device if the data has been normally written to the storage unit, and in the second mode, the control unit indicates the storage control unit to write the received data to the storage unit when receiving the write command and the data from the host device, and the control unit does not return the acknowledgment to the host device.

In this case, in the first mode, if the data has been normally written to the storage unit, the storage device can return the acknowledgment to the host device. The host device can, therefore, determine whether or not the data has been normally written to the storage unit in each storage device. In the second mode, the host device can move to a state of transmitting the data to the next storage device without waiting for return of the acknowledgment from one storage device, that is, without waiting for completion with writing of the data to the storage unit of one storage device. It is, therefore, possible to shorten overall time required for data write processing on a plurality of storage devices.

It is preferable that the storage device according one aspect of the invention further includes a reset terminal, and that the control unit determines whether the operation mode is the first operation mode or the second operation mode based on a voltage level of the reset terminal in an internal acknowledgment waiting period, the internal acknowledgment waiting period being a period of waiting for an internal acknowledgment from the storage control unit after reception of data packets.

By doing so, the control unit can select one of the first or second mode based on the voltage level of the reset terminal. Since it is the host device that sets the voltage level of the reset terminal, the host device can set the operation mode of the control unit.

It is preferable that the storage device according to one aspect of the invention further includes: a clock terminal; and a data terminal, that the control unit determines that the operation mode is the first mode if the voltage level of the reset terminal is a logic level indicating reset cancel in the internal acknowledgment waiting period, and that the control unit outputs a signal at a logic level representing the acknowledgment to the data terminal if a voltage level of the clock terminal is a first logic level and the data has been normally written to the storage device.

By doing so, the operation mode of the storage device can be set to the first mode if the host device sets the voltage level of the reset terminal to the logic level for indicating reset cancel. It is also possible to notify the storage device that the host device is in a state of being able to receive the acknowledgment if the host device sets the voltage level of the clock terminal to the first logic level. Furthermore, the host device can determine whether or not the acknowledgment is present based on the voltage level of the data terminal.

It is preferable that the control unit determines that the operation mode is the second mode if the voltage level of the reset terminal is equal to a logic level indicating reset in the internal acknowledgment waiting period.

By doing so, the operation mode of the storage device can be set to the second mode if the host device sets the voltage level of the reset terminal to the logic level for indicating reset.

It is preferable that the control unit moves into a command unacceptable state in the internal acknowledgment waiting period.

By doing so, it is possible to write the data to the storage unit in the storage device without influence of the command transmitted by the host device to another storage device in the internal acknowledgment waiting period.

According to another aspect of the invention, a host device includes: a communication processing unit performing communication processing for communication with a first storage device to an n-th storage device connected to the host device via a bus, where n is an integer equal to or greater than 2; and a control unit controlling the communication processing unit, wherein an operation mode of the communication processing unit is a first mode or a second mode, in the first mode, the communication processing unit moves into a state of waiting for return of an acknowledgment from an m-th storage device, where m is an integer satisfying $1 \leq m \leq n$, after transmitting a write command and data to the m-th storage device among the first storage device to the n-th storage device, and in the second mode, the communication processing unit moves into a state of transmitting the write command and the data to an (m+1)-th storage device without waiting for the acknowledgment from the m-th storage device after transmitting the write command and the data to the m-th storage device.

In this case, in the first mode, the communication processing unit can receive the acknowledgment from the m-th storage device. The host device can, therefore, determine whether or not the data has been normally written to the storage unit in each storage device. In the second mode, the host device can move to a state of transmitting the data to the (m+1)-th storage device without waiting for return of the acknowledgment from the m-th storage device, that is, without waiting for completion with writing of the data to the storage unit of the (m+1)-th storage device. It is, therefore, possible to shorten overall time required for data write processing on a plurality of storage devices.

It is preferable that the host device according to another aspect of the invention further includes a reset terminal, and that in the second mode, the communication processing unit sets a voltage level of the reset terminal to a logic level for indicating reset after transmitting a data packet to the m-th storage device, thereby notifying the m-th storage device that the operation mode is the second mode.

By doing so, the operation mode of the m-th storage device can be set to the second mode if the host device sets the voltage level of the reset terminal to the logic level for indicating reset.

It is preferable that the host device according to another aspect of the invention further includes a clock terminal, in the first mode, the communication processing unit sets a voltage level of the clock terminal to a first logic level after transmitting the data packet to the m-th storage device, and that in the second mode, the control unit sets the voltage level of the clock terminal to a second logic level after transmitting the data packet.

By doing so, it is possible to notify the m-th storage device that the host device is in a state of being able to receive the acknowledgment if the host device sets the voltage level of the clock terminal to the first logic level.

It is preferable that in the second mode, if it is assumed that a length of a necessary write period for writing the data to the m-th storage device is tTM and a length of a transmission waiting period is tTW, the transmission waiting period being a period since transmitting the data packet to the m-th storage device until transmitting the write command to the (m+1)-th storage device, the lengths tTM and tTW satisfy tTW<tTM.

By doing so, it is possible to transmit the write command to the (m+1)-th storage device before passage of the necessary write period for the m-th storage device. It is, therefore, possible to shorten overall time required for the data write processing on a plurality of storage devices.

According to yet another aspect of the invention, a circuit board includes the storage device according to one aspect of the invention.

According to still another aspect of the invention, a liquid container includes the storage device according to one aspect of the invention.

According to a still further aspect of the invention, a system includes: a host device; and a first storage device to an n-th storage device, where n is an integer equal to or greater than 2, connected to the host device via a bus, wherein the host device includes: a communication processing unit performing communication processing for communication with the first storage device to the n-th storage device; and a host control unit controlling the communication processing unit, an operation mode of the communication processing unit is a first mode or a second mode, in the first mode, the communication processing unit moves into a state of waiting for return of an acknowledgment from an m-th storage device, where m is an integer satisfying 1≤m≤n, after transmitting a write command and data to the m-th storage device among the first storage device to the n-th storage device, in the second mode, the communication processing unit moves into a state of transmitting the write command and the data to an (m+1)-th storage device without waiting for the acknowledgment from the m-th storage device after transmitting the write command and the data to the m-th storage device, the m-th storage device includes: a control unit performing communication processing for communication with the host device; a storage unit, the data from the host device being written to the storage unit; and a storage control unit exerting access control over the storage unit, in the first mode, the control unit indicates the storage control unit to write the data received from the host device to the storage unit when receiving the write command and the data from the host device, and the control unit returns the acknowledgment to the host device if the data has been normally written to the storage unit, and in the second mode, the control unit indicates the storage control unit to write the received data to the storage unit when receiving the write command and the data from the host device, and the control unit does not return the acknowledgment to the host device.

In the system according to the still further aspect of the invention, it is preferable that the host device includes a reset terminal, in the second mode, the communication processing unit sets a voltage level of the reset terminal to a logic level for indicating reset after transmitting a data packet to the m-th storage device, the m-th storage device includes a reset terminal, and that the control unit determines whether the operation mode is the first operation mode or the second operation mode based on a voltage level of the reset terminal in an internal acknowledgment waiting period, the internal acknowledgment waiting period being a period of waiting for an internal acknowledgment from the storage control unit after reception of data packets.

BRIEF DESCRIPTION OF THE DRAWINGS

The invention will be described with reference to the accompanying drawings, wherein like reference numbers denote like elements.

DESCRIPTION OF EXEMPLARY EMBODIMENT

An embodiment of the invention will be described in detail. It is to be noted that the embodiment described below does not intend to unduly limit the invention, and that all configurations to be described in the embodiment are not necessarily essential to attaining the advantage of the invention.

1. Storage Device and Host Device

Figure 1:
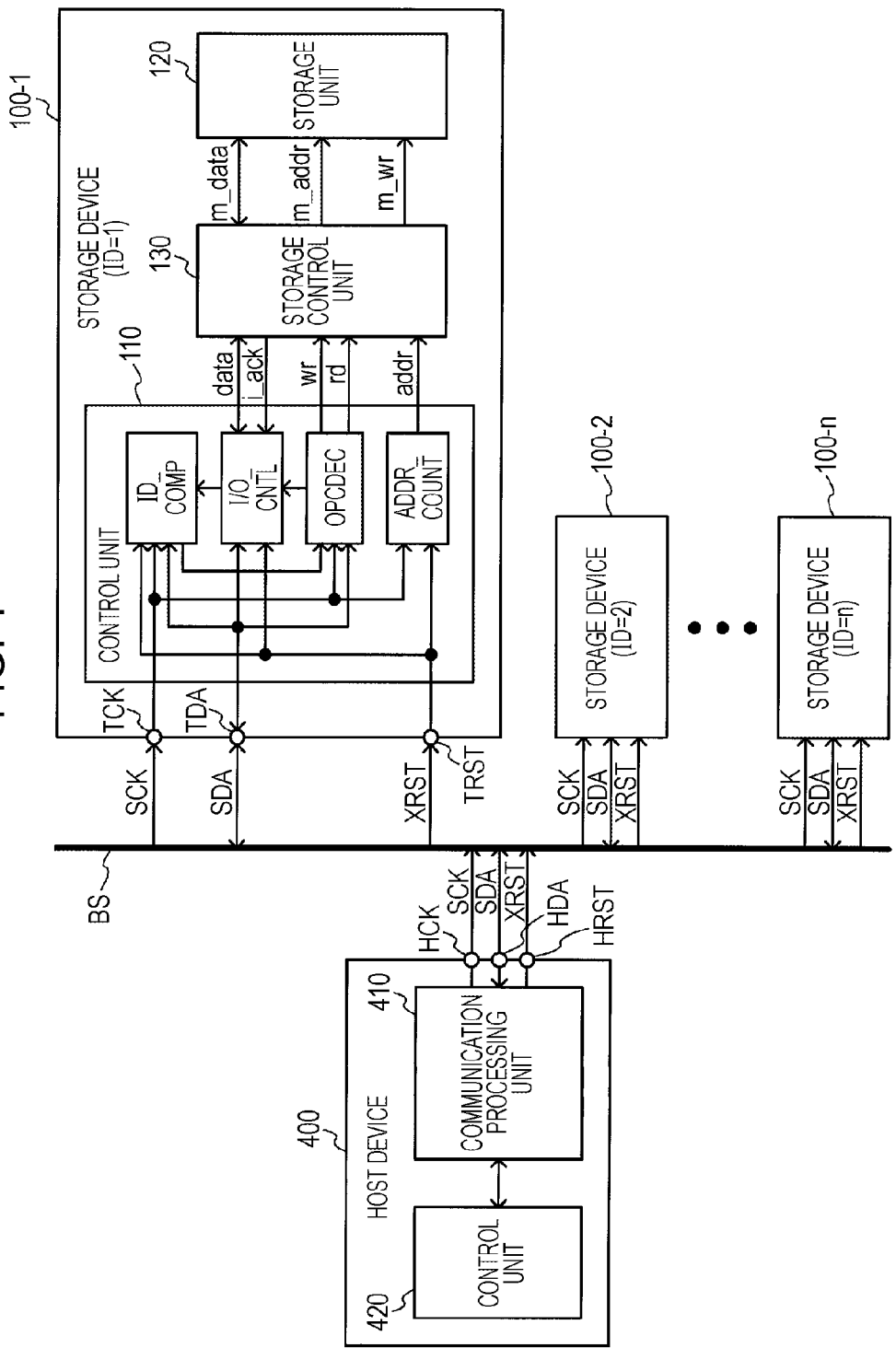
FIG. 1 exemplarily shows basic configurations of a storage device and a host device according to an embodiment of the invention.

FIG. 1 exemplarily shows basic configurations of a storage device and a host device according to an embodiment of the invention. A storage device 100 according to the embodiment includes a control unit 110, a storage unit 120, a storage control unit 130, a clock terminal TCK, a data terminal TDA, and a reset terminal TRST. A host device 400 according to the embodiment includes a communication processing unit 410, a control unit 420, a host clock terminal HCK (hereinafter, also simply "clock terminal HCK"), a host data terminal HDA (hereinafter, also simply "data terminal HDA"), and a host reset terminal HRST (hereinafter, also simply "reset terminal HRST"). Note that the configurations of the storage device 100 and the host device 400 according to the embodiment are not limited to those shown in FIG. 1 but various changes or modifications can be made of the configurations such as partial omission or replacement of the constituent elements of the storage device 100 and the host device 400 or addition of other constituent elements thereto.

A plurality of storage devices 100 (100-1 to 100-n, where n is an integer equal to or greater than 2, hereinafter also "first to n-th storage devices 100-1 to 100-n") is connected to the host device 400 via a bus BS. As shown in, for example, FIG. 1, the bus BS includes a clock signal line SCK, a data signal line SDA, and a reset signal line XRST. The host device 400 supplies clocks to the storage devices 100-1 to 100-n via the clock signal line SCK. The host device 400 transmits or receives data and the like to or from each storage device 100 via the data signal line SDA. Furthermore, the host device 400 outputs a reset signal to each of the storage devices 100-1 to 100-n via the rest signal line XRST.

Individual identification (ID) information is assigned to the storage devices 100-1 to 100-n, respectively. By designating one of the ID information, the host device 400 can transmit a command and data to one of the storage devices 100-1 to 100-n. In FIG. 1, for example, the ID information of the first storage device 100-1 is 1 (ID=1) and that of the second storage device 100-2 is 2 (ID=2).

Each storage device 100 includes the clock terminal TCK (first terminal in a broader sense), the data terminal TDA (second terminal in a broader sense), and the reset terminal TRST (third terminal in a broader sense). The clock signal line SCK is connected to the clock terminal TCK, the data signal line SDA is connected to the data terminal TDA, and the reset signal line XRST is connected to the reset terminal TRST.

The control unit 110 of each storage device 100 performs processing for communication ("communication processing") with the host device 400 connected to the storage device 100 via the bus BS. Specifically, as shown in FIG. 1, for example, the control unit 110 receives the command, write data and the like transmitted from the host device 400 via the data signal line SDA based on the clock and the reset signal from the host device 400. The control unit 110 also transmits data read from the storage unit 120, an acknowledgment, to be described later, and the like to the host device 400 via the data signal line SDA based on the clock and the reset signal from the host device 400.

The storage unit 120 is a nonvolatile memory device such as an EEPROM or a ferroelectric memory and the data from the host device 400 is written to the storage device 120. The storage control unit 130 exerts access control over the storage unit 120.

The control unit 110 includes, for example, an ID comparator ID_COMP, an I/O controller I/O_CNTL, an operation code decoder OPCDEC, and an address counter ADDR_COUNT. The ID comparator ID_COMP compares ID information transmitted from the host device 400 with that of the storage device 100 that includes the control unit 110 for matching determination. If the ID information transmitted from the host device 400 matches that of the storage device 100, then the ID comparator ID_COMP outputs an enable signal to the operation code decoder OPCDEC, and the operation code decoder OPCDEC decodes the command (operation code) transmitted from the host device 400. If the ID information transmitted from the host device 400 does not match that of the storage device 100, the ID comparator ID_COMP ignores the command transmitted from the host device 400.

Specifically, if the command transmitted from the host device 400 is a write command, the I/O controller I/O_CNTL receives write data from the host device 400 and outputs the received write data "data" to the storage control unit 130. The storage control unit 130 writes memory data m_data to the storage unit 120 based on a write signal wr from the operation code decoder OPCDEC. Address information addr used when the storage control unit 130 writes the memory data m_data to the storage unit 120 is generated by the address counter ADDR_COUNT based on clocks from the host device 400. Accordingly, the storage control unit 130 writes the write data m_data to consecutive addresses of the storage unit 120 sequentially, that is, in order of transmission. If having normally written the write data m_data to the storage unit 120, the storage control unit 130 outputs an internal acknowledgment signal i_ack to the I/O controller I/O_CNTL.

If the command transmitted from the host device 400 is a read command, the storage control unit 130 reads memory data m_data from the storage unit 120 based on a read signal rd from the operation code decoder OPCDEC. Address information addr used when the storage control unit 130 reads the memory data m_data from the storage unit 120 is similarly generated by the address counter ADDR_COUNT based on clocks from the host device 400. Accordingly, the storage control unit 130 reads the write data m_data sequentially.

An operation mode of the control unit 110 is either a first or second mode (first or second operation mode). In the first mode, when the control unit 110 receives the write command and the data from the host device 400, the control unit 110 indicates the storage control unit 130 to write the received data to the storage unit 120. Furthermore, if the storage control unit 130 has normally written the data to the storage unit 120, the control unit 110 returns an acknowledgment ACK to the host device 400. This acknowledgment ACK is intended to notify the host device 400 that the data has been normally written to the storage unit 120. By receiving the acknowledgment ACK, the host device 400 can recognize that data has been normally written to the storage unit 120 in each storage device 100.

On the other hand, in the second mode, when the control unit 110 receives the write command and the data from the host device 400, the control unit 110 indicates the storage control unit 130 to write the received data to the storage unit 120. However, differently from the first mode, the control unit 110 does not return the acknowledgment ACK to the host device 400. In the second mode, the host device 400 cannot recognize whether or not the data has been normally written to the storage unit 120 in each storage device 100. Nevertheless, as described later, in this second mode, it is possible to shorten overall time required for data write processing on the storage devices 100 connected to the host device 400 via the bus BS.

The operation mode of the control unit 110 is set to either the first or second mode based on an operation mode of the communication processing unit 410, to be described later, of the host device 400. That is, the control unit 110 determines whether the operation mode of the control unit 110 is the first or second mode based on a voltage level of the reset terminal TRST in an internal acknowledgment waiting period IAKW that is a period in which the control unit 110 waits for the internal acknowledgment signal i_ack from the storage control unit 130 after reception of data packets. This determination will be described later in detail.

For example, a state machine can realize the operation mode (first or second mode) of the control unit 110. Specifically, this state machine makes the transition from one state to another state based on such inputs as the write command, the internal acknowledgment signal i_ack, and the voltage level of the reset terminal TRST (reset signal), and outputs a predetermined instruction (such as a data write instruction or an acknowledgment ACK return instruction) in the state after the transition.

The host device 400 includes the communication processing unit 410, the control unit 420, the clock terminal HCK, the data terminal HDA, and the reset terminal HRST. The communication processing unit 410 performs communication processing with the storage devices 100-1 to 100-n connected to the host device 400 via the bus BS. The control unit 420 controls the communication processing unit 410.

The operation mode of the communication processing unit 410 is either the first or second mode. In the first mode, after transmitting the write command and the data to an m-th storage device 100-m, where m is an integer satisfying 1≤m≤n, among the first to n-th storage devices 100-1 to 100-n, the communication processing unit 410 moves to a state of waiting for return of the acknowledgment ACK from the m-th storage device 100-m. After receiving the acknowledgment ACK from the m-th storage device 100-m, the communication processing unit 410 transmits a write command and data to an (m+1)-th storage device 100-m+1. By receiving the acknowledgment ACK from each storage device 100, the host device 400 can recognize that the data has been normally written to the storage unit 120 in each storage device 100.

In the second mode, after transmitting the write command and the data to the m-th storage device 100-m, the communication processing unit 410 moves to a state of transmitting the write command and the data to the (m+1)-th storage device 100-m+1 without waiting for return of the acknowledgment ACK from the m-th storage device 100-m. In the second mode, the host device 400 cannot recognize whether or not the data has been normally written to the storage unit 120 in each storage device 100. However, as described later, in the second mode, it is possible to shorten overall time required for data write processing on the storage devices 100 connected to the host device 400 via the bus BS.

In the second mode, the communication processing unit 410 sets a voltage level of the reset terminal HRST to a logic level for indicating reset after transmission of data packets to the m-th storage device 100-m. The communication processing unit 410 thereby notifies the m-th storage device 100-m that the operation mode is the second mode. The control unit 110 of the m-th storage device 100-m can determine whether the operation mode is the first or second mode based on the voltage level of the reset terminal TRST in the internal acknowledgment waiting period IAKW.

According to the embodiment, in the first mode, the host device 400 can receive the acknowledgment ACK from each storage device 100 and, therefore, determine whether or not the data has been normally written to the storage unit 120 in each storage device 100. In the second mode, the host device 400 can move to the state of transmitting the data to the next storage device 100 without waiting for return of acknowledgment ACK from each storage device 100. In the second mode, therefore, it is possible to shorten the overall time required for the data write processing on the storage devices 100.

2. Write Processing in the First Mode

Figure 2:
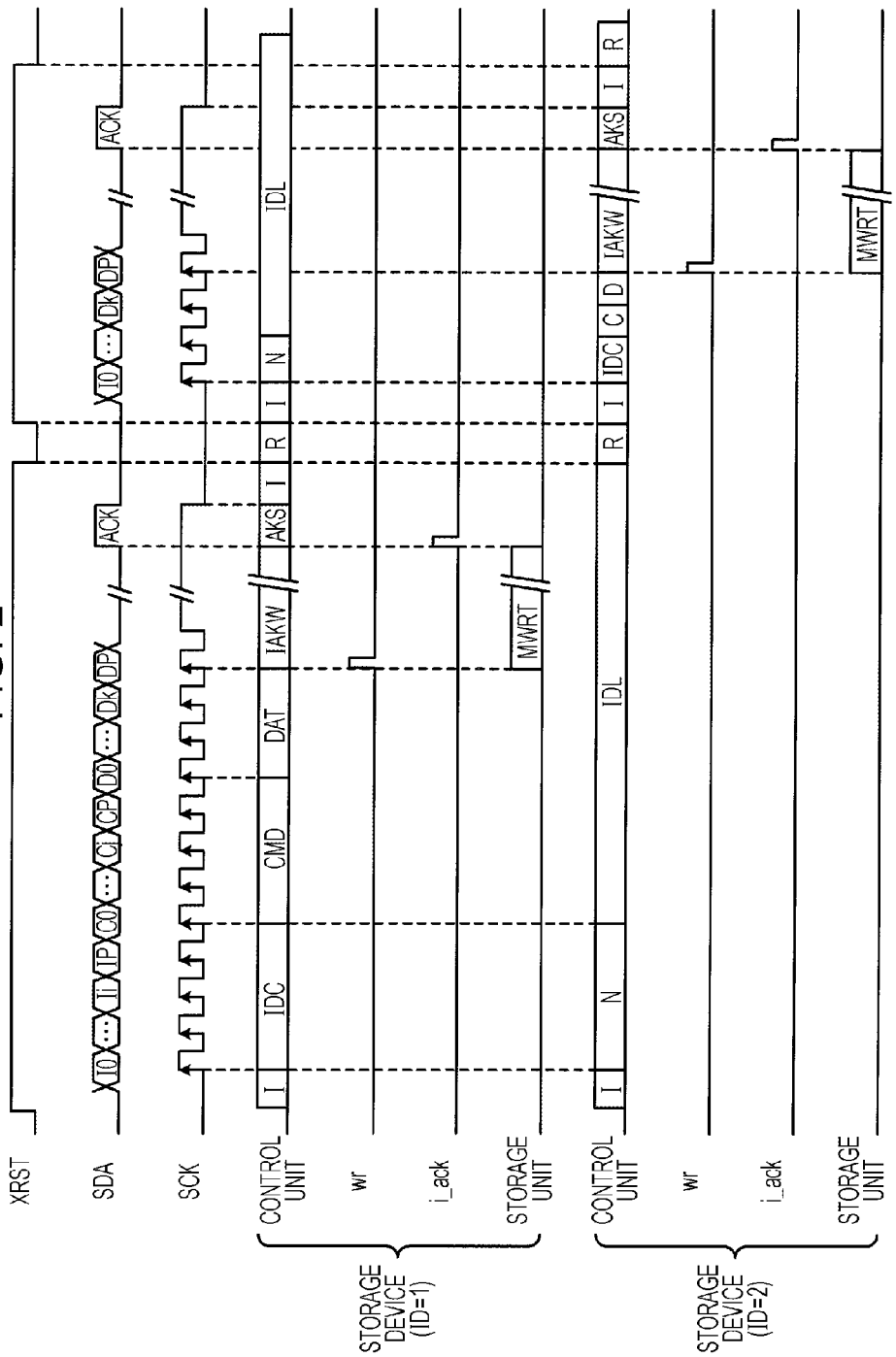
FIG. 2 is a timing chart illustrating operation in a first mode according to the embodiment.

FIG. 2 is a timing chart illustrating operation performed by the storage devices 100 in the first mode according to the embodiment. FIG. 2 shows signal waveforms of the reset signal XRST, the clock signal SCK, and the data signal SDA, operation states of the control units 110 and the storage units 120 in the two storage devices 100-1 (ID=1) and 100-2 (ID=2), and signal waveforms of the internal signals wr and i_ack.

In FIG. 2, symbol I or IDL denotes an idle period, IDC denotes an ID recognition period, C or CMD denotes a command recognition period, and D or DAT denotes a data reception period. Furthermore, IAKW denotes the internal acknowledgment waiting period, MWRT denotes a memory write period, AKS denotes an acknowledgment return period, R denotes a reset period, and N denotes an ID nonmatching recognition period for recognizing that the received ID information does not match the ID information of the storage device 100 concerned.

If the reset signal XRST is at H level (high potential level, which is a first logic level in a broader sense), the storage device 100 is in a reset cancel state. If the reset signal XRST is at L level (low level, which is a second logic level in a broader sense), the storage device 100 is in a reset state. In a period in which the reset signal XRST is at the H level, that is, a period in which reset is cancelled, the control unit 110 is in an operative state (active state) and can receive the command and the data from the host device 400 or transmit the acknowledgment ACK to the host device 400.

Initially, the host device 400 sets the reset signal XRST from L level to H level and cancels resetting the storage devices 100. The control unit 110 of each storage device 100 is in an idle state (in a period denoted by I in FIG. 2), accordingly.

Next, the host device 400 transmits the ID information, the write command, and the data to the first storage device 100-1 (ID=1). As shown in FIG. 2, the ID information is a set of, for example, i+1 bits of I0 to Ii, where i is a natural number, with the addition of a parity bit IP thereto. The write command is a set of, for example, j+1 bits of C0 to Cj, where j is a natural number, with the addition of a parity bit CP thereto. The data is a set of, for example, k+1 bits of D0 to Dk, where k is a natural number, with the addition of a parity bit DP thereto. The parity bits IP, CP, and DP are bits added for parity check and set so that the sum of one-bits is always odd or even.

The comparator ID_COMP of the first storage device 100-1 (ID=1) recognizes that the received ID information matches the ID information of the first storage device 100-1 in an ID recognition period IDC. In a subsequent command recognition period CMD, the operation code decoder OPCDEC recognizes that the received command is the write command. In a next data reception period DAT, the I/O controller I/O_CNTL receives the data and outputs the received data to the storage control unit 130. The operation code decoder OPCDEC outputs the write signal wr to the storage control unit 130 and the storage control unit 130 writes the data to the storage unit 120 in a memory write period MWRT. This memory write period MWRT corresponds to an internal acknowledgment waiting period IAKW of the control unit 110, and the control unit 110 waits for output of the internal acknowledgment signal i_ack from the storage control unit 130. If the data has been normally written, the storage control unit 130 outputs the internal acknowledgment signal i_ack to the control unit 110. Upon receiving the internal acknowledgment signal i_ack, the control unit 110 returns the acknowledgment ACK to the host device 400 in an acknowledgment return period AKS.

After transmitting the ID information, the write command, and the data to the first storage device 100-1 (ID=1), the communication processing unit 410 of the host device 400 keeps the clock signal SCK to H level. This can notify the storage device 100-1 that the host device 400 is in a state of being able to receive the acknowledgment ACK. After the host device 400 receives the acknowledgment ACK, the communication processing unit 410 returns the clock signal SCK to L level and then sets the reset signal XRST to L level, thereby resetting the storage device 100-1 in a reset period R.

On the other hand, the control unit 110 of the second storage device 100-2 (ID=2) recognizes that the received ID does not match the ID information of the second storage device 100-2 in a first ID recognition period IDC which is, therefore, indicated by an ID nonmatching recognition period N in FIG. 2. Accordingly, the control unit 110 does not receive the command and data in an idle period IDL. If the control unit 110 recognizes that the received ID information matches the ID information of the second storage device 100-2 in an ID recognition period IDC, the control unit 110 receives the write command and data in a command recognition period C and a data recognition period D. In a memory write period MWRT, the storage control unit 130 writes the data to the storage unit 120. This memory write period MWRT corresponds to an internal acknowledgment waiting period IAKW of the control unit 110, and the control unit 110 waits for output of the internal acknowledgment signal i_ack from the storage control unit 130. If the data has been normally written to the storage unit 120, then the storage control unit 130 outputs the internal acknowledgment signal i_ack to the control unit 110, and the control unit 110 returns the acknowledgment ACK to the host device 400 in an acknowledgment return period AKS.

As stated so far, if the voltage level of the reset terminal TRST is at H level (logic level for indicating reset cancel in a broader sense) in the internal acknowledgment waiting period IAKW, the control unit 110 determines that the operation mode is the first mode. If the voltage level of the clock terminal TCK is at H level (first logic level in a broader sense) and the data has been normally written to the storage unit 120, the control unit 110 outputs a signal at a logic level (for example, H level in FIG. 2) representing the acknowledgment ACK to the data terminal TDA.

Moreover, in the first mode, the communication processing unit 410 of the host device 400 sets the voltage level of the clock terminal HCK to H level (first logic level in a broader sense) after transmitting the data packets to the storage device 100. This can notify the storage device 100 that the host device 400 is in the state of being able to receive the acknowledgment ACK.

Figure 3:
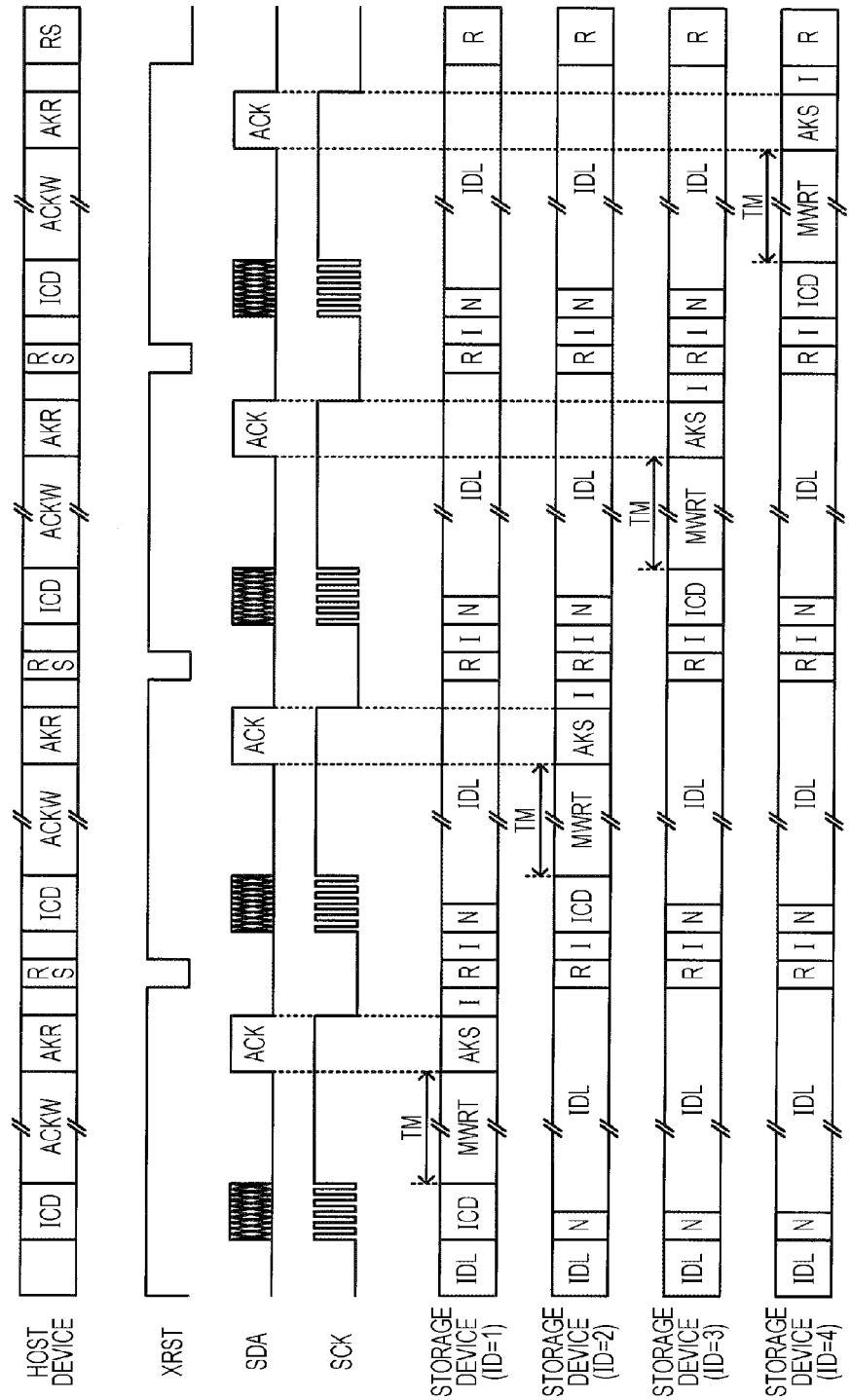
FIG. 3 is a timing chart illustrating overall data write processing in the first mode.

FIG. 3 is a timing chart illustrating overall data write processing in the first mode if four storage devices 100-1 to 100-4 (ID=1 to 4) are connected to the host device 400 via the bus BS. FIG. 3 shows signal waveforms of the reset signal XRST, the clock signal SCK, and the data signal SDA, and operation states (states) of the host device 400 and the four storage devices 100, respectively. Note that similar data write processing to that shown in FIG. 3 can be performed even if the number of storage devices 100 is not four.

In FIG. 3, symbol ICD denotes an ID information, command, and data transmission period (or reception period), ACK denotes an acknowledgment waiting period, AKR denotes an acknowledgment reception period, RS denotes a period for making the reset signal XRST active, I or IDL denotes the idle period, MWRT denotes the memory writ period, AKS denotes the acknowledgment return period, R denotes the reset period, and N denotes the ID nonmatching period for recognizing that the received ID information does not match the ID information of the storage device 100 concerned.

As shown in FIG. 3, in the first mode, the host device 400 transmits the data to the first storage device 100-1 (ID=1), the data is normally written to the storage unit 120 of the first storage device 100-1, and the first storage device 100-1 returns the acknowledgment ACK to the host device 400. Likewise, the host device 400 performs the data write processing on the second to fourth storage devices 100-2 to 100-4 (ID=2 to ID=4).

In the first mode, after the memory write period MWRT subsequent to reception of the data, that is, after passage of a necessary write period TM, one storage device 100 returns the acknowledgment ACK to the host device 400. After receiving the acknowledgment ACK, the host device 400 starts data write processing on the next storage device 100. Due to this, if a length of the necessary write period TM is assumed as tTM and, for example, the four storage devices 100 are connected to the host device 400 as shown in FIG. 3, it requires 4×tTM besides time required for communication of the data and the like. Normally, the time required for writing data to a storage device is longer than that required for communication. For example, the time required for communication of the data and the like with one storage device 100 is about 100 μm whereas the length tTM of the necessary write period TM is about five ms. Accordingly, in FIG. 3, a length of the entire necessary write periods TMs is about 20 ms.

In this way, in the first mode, the host device 400 can receive acknowledgment ACK from each storage device 100 and, therefore, determine whether or not the data has been normally written to the storage unit 120 in each storage device 100 but requires longer write time as a whole.

3. Write Processing in the Second Mode

Figure 4:
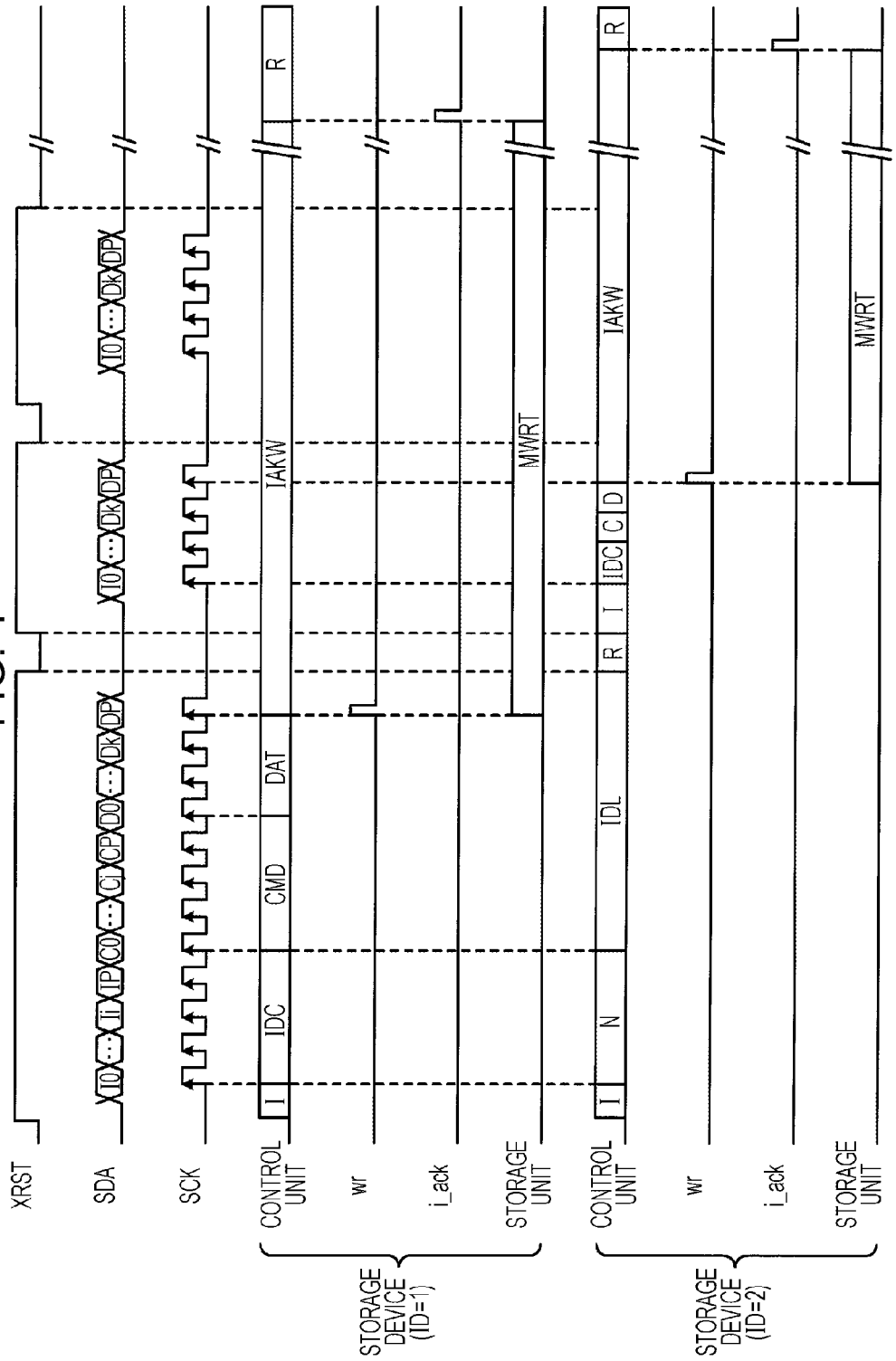
FIG. 4 is a timing chart illustrating operation in a second mode.

FIG. 4 is a timing chart illustrating operation performed by the storage devices 100 in the second mode according to the embodiment. FIG. 4 shows the signal waveforms of the reset signal XRST, the clock signal SCK, and the data signal SDA, the operation states of the control units 110 and the storage units 120 in the two storage devices 100-1 (ID=1) and 100-2 (ID=2), and the signal waveforms of the internal signals wr and i_ack. Since the symbols shown in FIG. 4 are identical to those shown in FIG. 2, the symbols are not described herein.

Initially, the host device 400 sets the reset signal XRST from L level to H level to cancel resetting the storage devices 100. The control unit 110 of each storage device 100 is in an idle state, accordingly. Next, the host device 400 transmits the ID information, the write command, and the data to the first storage device 100-1 (ID=1).

The comparator ID_COMP of the first storage device 100-1 (ID=1) recognizes that the received ID information matches the ID information of the first storage device 100-1 in the ID recognition period IDC. In the subsequent command recognition period CMD, the operation code decoder OPCDEC recognizes that the received command is the write command. In the next data reception period DAT, the I/O controller I/O_CNTL receives the data and outputs the received data to the storage control unit 130. The operation code decoder OPCDEC outputs the write signal wr to the storage control unit 130 and the storage control unit 130 writes the data to the storage unit 120 in the memory write period MWRT. This memory write period MWRT corresponds to the internal acknowledgment waiting period IAKW of the control unit 110, and the control unit 110 waits for output of the internal acknowledgment signal i_ack from the storage control unit 130.

After transmitting the ID information, the write command, and the data to the first storage device 100-1 (m-th storage device 100-*m* in a broader sense), the communication processing unit 410 of the host device 400 sets a voltage level of the clock terminal HCK to L level (second logic level in a broader sense). Next, the communication processing unit 410 sets the reset signal XRST to L level to reset the bus BS. After returning the reset signal XRST to H level to cancel resetting the bus BS, the communication processing unit 410 starts transmitting the ID information, the write command, and the data to the next storage device 100-2 (ID=2).

By setting the voltage level of the reset terminal HRST to L level (logic level for indicating reset in a broader sense) after transmitting the data packets to the first storage device 100-1 (m-th storage device 100-*m* in a broader sense), the communication processing unit 410 of the host device 400 notifies the first storage device 100-1 (m-th storage device 100-*m* in a broader sense) that the operation mode is the second mode.

If the voltage level of the reset terminal TRST is at L level (logic level for indicating reset in a broader sense) in the internal acknowledgment waiting period IAKW, the control unit 110 of the first storage device 100-1 (ID=1) determines that the operation mode is the second mode. The control unit 110 that has determined that the operation mode is the second mode indicates the storage control unit 130 to write the received data to the storage unit 120 but does not return acknowledgment ACK to the host device 400.

In the memory write period MWRT (internal acknowledgment waiting period IAKW) of the first storage device 100-1 (ID=1), that is, while the data is being written to the storage unit (memory) 120 of the first storage device 110-1, data transmission processing for transmitting the data to the second storage device 100-2 (ID=2) is executed concurrently. However, the data transmission processing on the second storage device 100-2 (ID=2) does not affect the memory write processing performed in the first storage device 100-1 (ID=1). This is because the control unit 110 of each storage device 100 does not accept the command from the host device 400 in the internal acknowledgment waiting period IAKW.

If the storage control unit 130 of the first storage device 100-1 (ID=1) has normally written the data to the storage unit 120, the storage control unit 130 outputs the internal acknowledgment signal i_ack to the control unit 110. If receiving the internal acknowledgment signal i_ack, the control unit 110 is set into a reset state without returning the acknowledgment ACK to the host device 400.

In the second storage device 100-2 (ID=2), similarly to the first storage device 100-1 (ID=1), if the control unit 130 writes the data to the storage unit 120 and the data has been normally written in the memory write period MWRT, the storage control unit 130 outputs the internal acknowledgment signal i_ack to the control unit 110. If receiving the internal acknowledgment signal i_ack, the control unit 110 is set into a reset state without returning the acknowledgment ACK to the host device 400.

As stated so far, if the voltage level of the reset terminal TRST is L level (logic level for indicating reset in a broader sense) in the internal acknowledgment waiting period IAKW, the control unit 110 determines that the operation mode is the second mode. The control unit 110 indicates the storage control unit 130 to write the received data to the storage unit 120 but does not return the acknowledgment ACK to the host device 400.

In the second mode, the communication processing unit 410 of the host device 400 moves to a state of transmitting the write command and the data to the (m+1)-th storage device 100-*m*+1 without waiting for return of the acknowledgment ACK from the m-th storage device 100-*m* after transmitting the write command and the data to the m-th storage device 100-*m*. Further, by setting the voltage level of the reset terminal HRST to L level (logic level for indicating reset in a broader sense) after transmitting the data packets to the m-th storage device 100-*m*, the communication processing unit 410 can notify the m-th storage device 100-*m* that the operation mode is the second mode.

Figure 5:
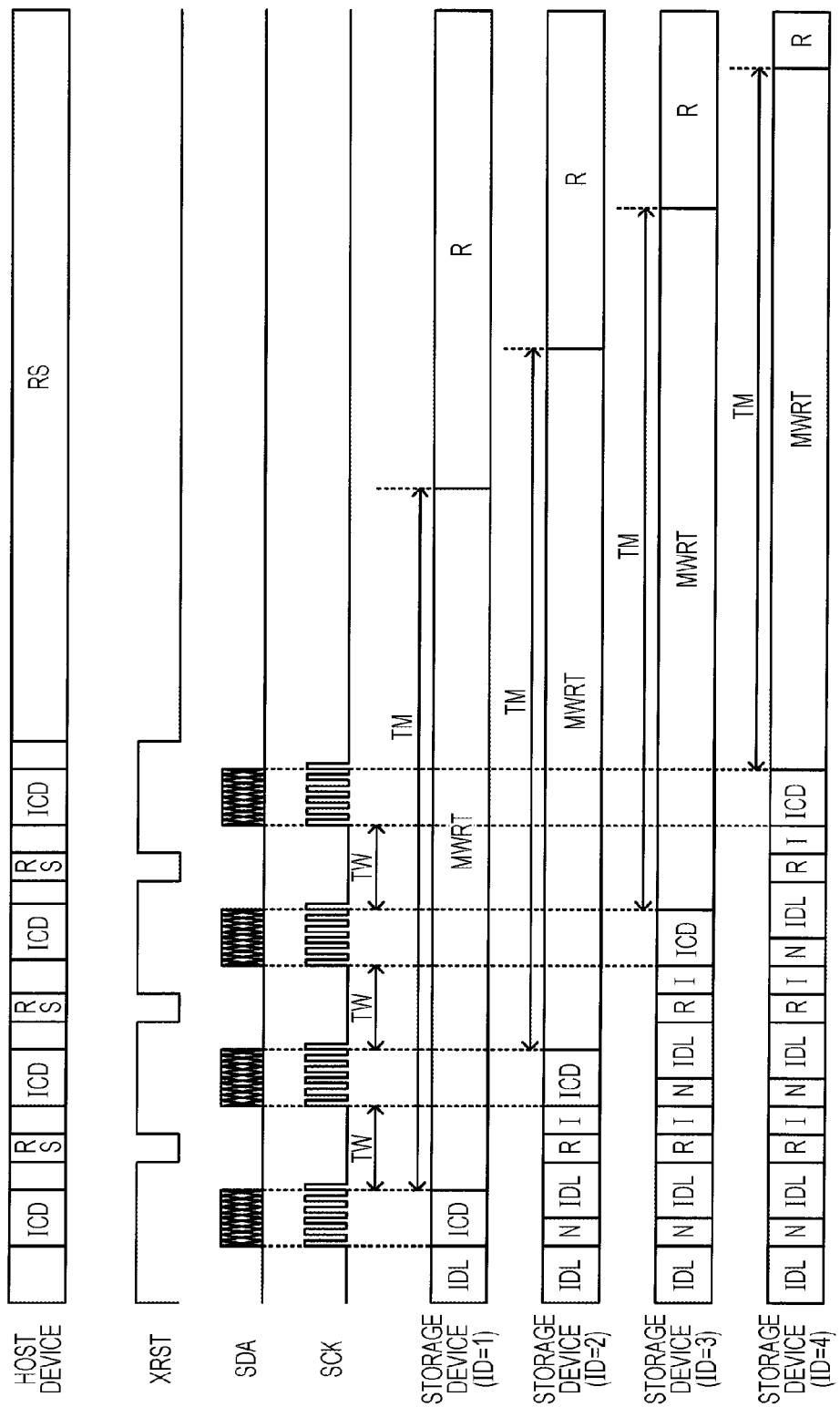
FIG. 5 is a timing chart illustrating overall data write processing in the second mode.

FIG. 5 is a timing chart illustrating the overall data write processing in the second mode if the four storage devices 100-1 to 100-4 (ID=1 to 4) are connected to the host device 400 via the bus BS. FIG. 5 shows signal waveforms of the reset signal XRST, the clock signal SCK, and the data signal SDA, and operation states (states) of the host device 400 and the four storage devices 100, respectively. Note that similar data write processing to that shown in FIG. 5 can be performed even if the number of storage devices 100 is not four. Since the symbols shown in FIG. 5 are identical to those shown in FIG. 3, the symbols are not described herein.

As shown in FIG. 5, in the second mode, after a transmission waiting period TW subsequent to the transmission processing performed by the host device 400 on the first storage device 100-1 (ID=1), the host device 400 starts performing transmission processing on the second storage device (ID=2). Likewise, the host device 400 performs the transmission processing on the third and fourth storage devices 100-3 (ID=3) and 100-4 (ID=4).

In the first storage device 100-1 (ID=1), the storage control unit 130 executes data write processing for writing the received data to the storage unit 120 in the memory write period MWRT after receiving the data from the host device 400. Concurrently with this write processing, the second storage device 100-2 performs processing for receiving the data and starts data write processing for writing the data to the storage unit (memory) 120. In this way, the write processing is concurrently performed in the first to fourth storage devices 100-1 (ID=1) to 100-4 (ID=4). It is, therefore, possible to shorten the overall data write processing time.

Specifically, if it is assumed that communication time for communication of data and the like is tCOM, a length of the transmission waiting period TW is tTW, and that the length of the necessary write period TM for writing the data to the storage unit (memory) 120 is tTM, the overall write processing time is represented by 4×tCOM+3×tTW+tTM in, for example, FIG. 5. Normally, the time required for writing data to a storage device is longer than that required for communication. For example, the tCOM and tTW amount to about 100 μm and the tTM is about five ms, so that the overall write processing time amounts to about 5.7 ms. As stated, in the first mode, the overall write processing time is longer than 4×tTM=2 ms. Therefore, by using the second mode, it is possible to shorten the overall write processing time.

As stated so far, in the second embodiment, if assuming that the length of the necessary write period TM for writing the data to the m-th storage device 100-*m* is tTM and the length of the transmission waiting period TW that is the period since the host device 400 transmits the data packets to the m-th storage device 100-*m* until transmitting the write command to the (m+1)-th storage device 100-*m*+1 is tTW, tTW and tTM satisfy the relation of tTW<tTM. The host device 400 can thereby transmit the write command to the (m+1)-th storage device 100-*m*+1 before passage of the necessary write period TM for the m-th storage device 100-*m*. It is, therefore, possible to shorten the overall write processing time for writing the data to all the storage devices 100 connected to the host device 400 via the bus BS.

4. System, Liquid Container, and Circuit Board

Figure 6:
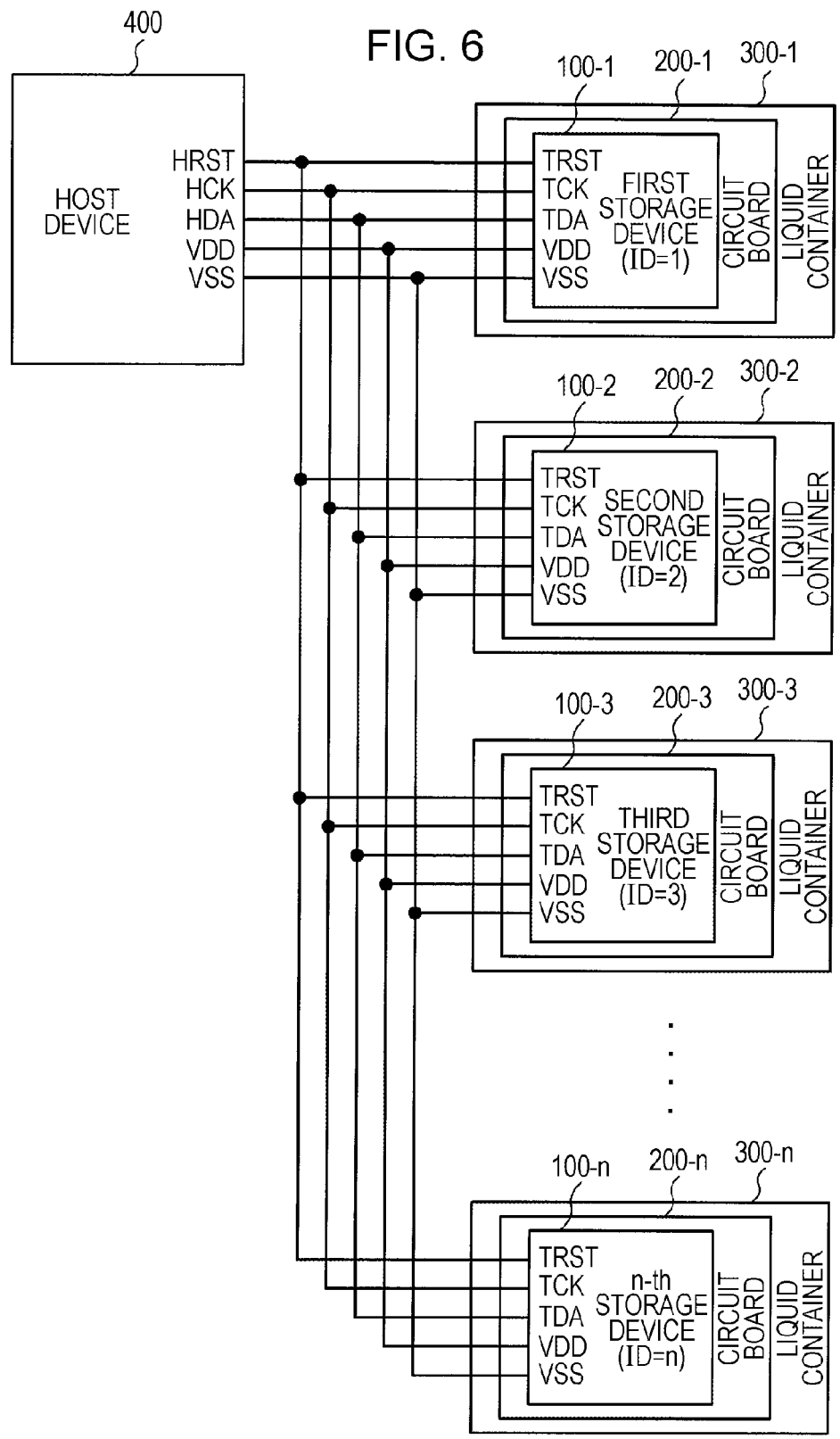
FIG. 6 exemplarily shows a basic configuration of a system according to the embodiment.

FIG. 6 exemplarily shows a basic configuration of a system according to the embodiment. The system according to the embodiment is, for example, an ink jet printer (hereinafter, simply "printer"). The system includes the first to n-th storage devices 100-1 to 100-n, where n is an integer equal to or greater than 2, n circuit boards 200-1 to 200-n (hereinafter, also generically "circuit boards 200") on which the storage devices 100 are mounted, respectively, n liquid containers 300-1 to 300-n (hereinafter, also generically "liquid containers 300") that include the respective circuit boards 200-1 to 200-n, and the host device 400. Note that the configuration of the system according to the embodiment is not limited to that shown in FIG. 6 but various changes or modifications can be made of the configuration such as partial omission or replacement of the constituent elements of the system or addition of other constituent elements thereto.

The system according to the embodiment will be described while referring to a case where the host device 400 is an ink jet printer main body (hereinafter, simply "printer main body"), the liquid containers 300 are ink cartridges, and the circuit boards 200 are circuit boards provided on the respective ink cartridges 300 by way of example. However, in the embodiment, the other types of device, container, and circuit board can represent the host device 400, the liquid containers 300, and the circuit boards 200, respectively. For example, the host device 400 can be a reader/writer of a memory card and the circuit board 200 can be a circuit board provided on the memory card.

Each of the first storage device 100-1 to the n-th storage device 100-n includes the reset terminal TRST, the clock terminal TCK, the data terminal TDA, a first power supply terminal VDD, and a second power supply terminal VSS. Each of the n storage devices 100-1 to 100-n includes the storage unit 120 (nonvolatile memory or the like). The storage units 120 store ID information (such as ID=1, ID=2, and ID=3) for identifying the n liquid container (ink cartridges) 300-1 to 300-n, respectively. Different IDs are assigned to the liquid containers 300 according to types such as colors of liquids contained in the liquid containers 300. Further, the host device 400 writes such data as a residual quantity of ink (or ink consumption quantity) of the liquid container 300 to each storage unit 120.

The host device 400, which is the printer main body, includes the reset terminal HRST, the clock terminal HCK, the data terminal HDA, a first power supply terminal VDD, and a second power supply terminal VSS.

As stated, according to the storage device 100, the host device 400, and the system of the embodiment, the host device (printer main body) 400 can select one of the two operation modes (first and second modes) in the data write processing for writing data to the storage devices 100 connected to the host device 400 via the bus BS.

In the first mode, the host device 400 can receive the acknowledgment ACK from each storage device 100 and, therefore, recognize that the data has been normally written in each storage device 100. Accordingly, if, for example, the system (printer) is ordinarily used, the host device (printer main body) 400 can perform rewrite processing (retry) on the storage device 100 to which the data has not normally written by performing the write processing in the first mode. As a result, reliability of the data (such as the ink residual quantity) stored in the storage device 100 enhances. This can reduce chances of defects including one that the liquid container 200 cannot be used although ink remains in the liquid container 200.

On the other hand, in the second mode, the host device 400 cannot recognize whether or not the data has been normally written to each storage device 100 but it is possible to shorten overall time required for writing the data to the storage devices 100. Therefore, if, for example, power outage occurs during use of the system (printer) or a user erroneously pulls a cord out of the wall, the host device 400 performs write processing in the second mode, thereby making it possible to complete the data write processing within short power-retaining time. As a result, a capacity of a power-retaining capacitor (not shown) can be reduced, which advantageously curtail the manufacturing cost of systems (printers).

Specifically, if abnormal power shutdown occurs due to, for example, power outage or pulling of the cord out of the wall, then a power supply circuit (not shown) of the host device (printer main body) 400 detects the power shutdown, and the control unit 420 indicates the communication processing unit 410 to write the data to the storage devices 100 in the second mode based on a detection result. The communication processing unit 410 can execute the data write processing in the second mode for writing the data to the storage devices 100-1 to 100-n connected to the host device 400 via the bus BS. As stated, since it is possible to shorten the write processing time in the second mode, the host device (ink jet printer main body) 400 can complete with writing of data to all the storage devices 100 within the limited power-retaining time.

Figure 7:
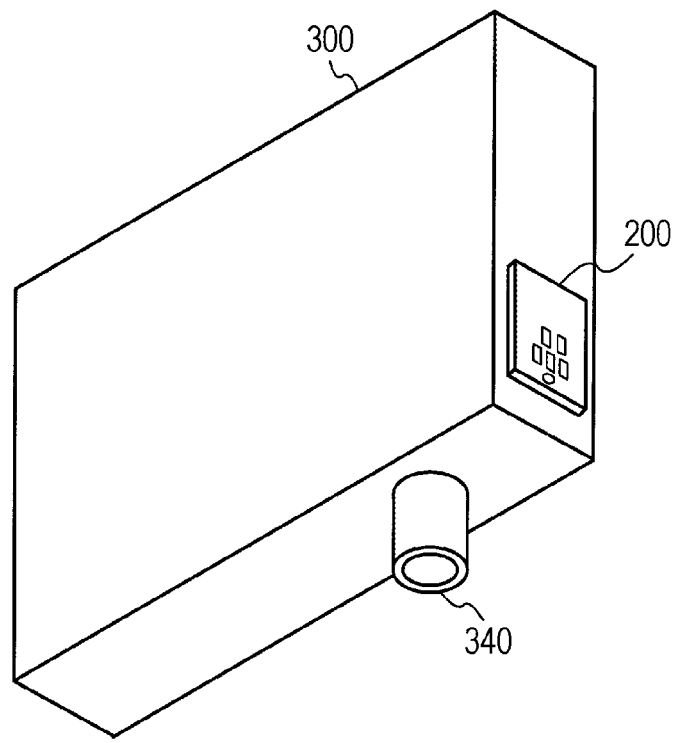
FIG. 7 exemplarily shows a detailed configuration of a liquid container according to the embodiment.

FIG. 7 exemplarily shows a detailed configuration of the liquid container (ink cartridge) 300 according to the embodiment. An ink reservoir (not shown) for containing ink is formed in the liquid container 300. An ink supply port 340 communicating with the ink reservoir is also provided on the liquid container 300. This ink supply port 340 is intended to supply ink to a print head unit (not shown) when the liquid container 300 is attached to the system (printer).

The liquid container 300 includes the circuit board 200. The storage device 100 according to the embodiment is mounted on the circuit board 200, stores such data as the ink consumption quantity, and transmits or receive data to or from the host device 400. The circuit board 200 is realized by, for example, a printed circuit board and provided on a surface of the liquid container 300. Terminals such as the first power supply terminal VDD are also provided on the circuit board 200. When the liquid container 300 is attached to the system (printer), the terminals of the circuit board 300 contact (are electrically connected to) those of the system (printer), thereby supply of power and transmission or reception of data are carried out.

Figure 8A:
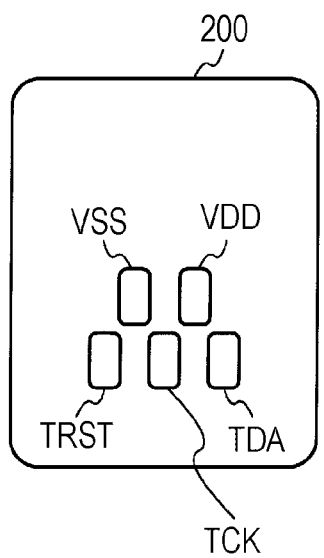
FIGS. 8A and 8B exemplarily show a detailed configuration of a circuit board according to the embodiment.
Figure 8B:
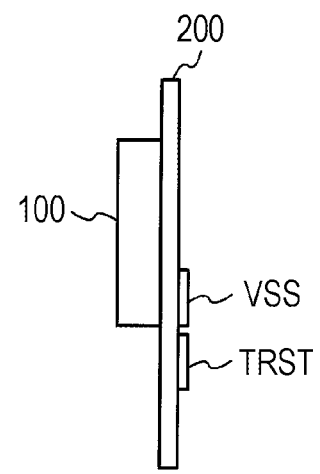

FIGS. 8A and 8B exemplarily show a detailed configuration of the circuit board 200 on which the storage device 100 according to the embodiment is mounted. As shown in FIG. 8A, a terminal group including a plurality of terminals is provided on a surface of the circuit board 200 (surface connected to the system (printer)). This terminal group includes the first power supply terminal VDD, the second power supply terminal VSS, the reset terminal TRST, the clock terminal TCK, and the data terminal TDA. Each terminal is realized by a metal terminal formed into, for example, a (generally) rectangular shape. Each terminal is connected to the storage device 100 via a wiring pattern layer and through-holes (not shown) provided on the circuit board 200.

As shown in FIG. 8B, the storage device 100 according to the embodiment is provided on a rear surface of the circuit board 200 (surface opposite to the surface connected to the system (printer)). The storage device 100 can be realized by, for example, a semiconductor memory device that includes a flash memory, a ferroelectric memory or the like. This storage device 100 stores various data relating to the ink or the liquid container 300, for example, data such as the ID information for identifying the liquid container 300 and the ink consumption quantity. The data on the ink consumption quantity is data indicating an aggregated quantity of ink consumed according to execution of printing or the like with respect to the ink contained in the liquid container 300. The data on the ink consumption quantity can be replaced by information indicating the quantity of ink in the liquid container 300 or information indicating a rate of the quantity of consumed ink.

While the embodiment has been described so far in detail, a person skilled in the art could readily understand that various modifications can be made of the invention without substantial departure from the new matter and advantages of the invention. Accordingly, such modifications are assumed to fall within the scope of the invention. For example, in the specification or drawings, a term used along with a different term in a broader sense or the same sense at least once can be replaced by the different term in any part of the specification or drawings. Moreover, the configurations and operations of the storage device, host device, circuit board, liquid container, and system are not limited to those described in the embodiment but can be carried out in various modified manners.

The entire disclosure of Japanese Patent Application No. 2010-228904, filed Oct. 8, 2010 is expressly incorporated by reference herein.

What is claimed is:

1. A storage device comprising:
a control unit performing communication processing for communication with a host device connected to the storage device via a bus;
a storage unit, data from the host device being written to the storage unit;
a storage control unit controlling access to the storage unit, wherein
an operation mode of the control unit is a first mode or a second mode,
in the first mode, the control unit indicates the storage control unit to write data received from the host device to the storage unit when receiving a write command and the data from the host device, and the control unit returns an acknowledgment to the host device after the data is written to the storage unit, and
in the second mode, the control unit indicates the storage control unit to write the received data to the storage unit when receiving the write command and the data from the host device, and the control unit does not return the acknowledgment to the host device; and
a reset terminal, wherein the control unit determines whether the operation mode is the first operation mode or the second operation mode based on a voltage level of the reset terminal in an internal acknowledgment waiting period, the internal acknowledgment waiting period being a period of waiting for an internal acknowledgment from the storage control unit after reception of data packets.

2. The storage device according to claim 1, further comprising:
a clock terminal; and
a data terminal, wherein
the control unit determines that the operation mode is the first mode if the voltage level of the reset terminal is a logic level indicating reset cancel in the internal acknowledgment waiting period, and
the control unit outputs a signal at a logic level representing the acknowledgment to the data terminal if a voltage level of the clock terminal is a first logic level and the data has been normally written to the storage device.

3. The storage device according to claim 2, wherein
the control unit determines that the operation mode is the second mode if the voltage level of the reset terminal is equal to a logic level indicating reset in the internal acknowledgment waiting period.

4. A circuit board comprising the storage device according to claim 3.

5. A liquid container comprising the storage device according to claim 3.

6. A liquid container comprising the storage device according to claim 2.

7. A circuit board comprising the storage device according to claim 2.

8. The storage device according to claim 1, wherein
the control unit moves into a command unacceptable state in the internal acknowledgment waiting period.

9. A circuit board comprising the storage device according to claim 8.

10. A circuit board comprising the storage device according to claim 1.

11. A liquid container comprising the storage device according to claim 1.

12. A circuit board comprising the storage device according to claim 1.

13. A liquid container comprising the storage device according to claim 1.

14. A host device comprising:
a communication processing unit performing communication processing for communication with a first storage device to an n-th storage device connected to the host device via a bus, where n is an integer equal to or greater than 2;
a control unit controlling the communication processing unit, wherein
an operation mode of the communication processing unit is a first mode or a second mode,
in the first mode, the communication processing unit moves into a state of waiting for return of an acknowledgment from an m-th storage device, where m is an integer satisfying 1≤m≤n, after transmitting a write command and data to the m-th storage device among the first storage device to the n-th storage device, and
in the second mode, the communication processing unit moves into a state of transmitting the write command and the data to an (m+1)-th storage device without waiting for the acknowledgment from the m-th storage device after transmitting the write command and the data to the m-th storage device; and
a reset terminal, wherein the control unit determines whether the operation mode is the first operation mode or the second operation mode based on a voltage level of the reset terminal in an internal acknowledgment waiting period, the internal acknowledgment waiting period being a period of waiting for an internal acknowledgment from a storage device control unit after reception of data packets.

15. The host device according to claim 14, wherein in the second mode, the communication processing unit sets a voltage level of the reset terminal to a logic level for indicating reset after transmitting a data packet to the m-th storage device, thereby notifying the m-th storage device that the operation mode is the second mode.

16. The host device according to claim 15, further comprising a clock terminal, wherein in the first mode, the communication processing unit sets a voltage level of the clock terminal to a first logic level after transmitting the data packet to the m-th storage device, and in the second mode, the control unit sets the voltage level of the clock terminal to a second logic level after transmitting the data packet.

17. The host device according to claim 14, wherein in the second mode, if it is assumed that a length of a necessary write period for writing the data to the m-th storage device is tTM and a length of a transmission waiting period is tTW, the transmission waiting period being a period since transmitting the data packet to the m-th storage device until transmitting the write command to the (m+1)-th storage device, the lengths tTM and tTW satisfy tTW<tTM.

18. A system comprising:

a host device; and a first storage device to an n-th storage device, where n is an integer equal to or greater than 2, connected to the host device via a bus, wherein the host device includes:

a communication processing unit performing communication processing for communication with the first storage device to the n-th storage device;

a host control unit controlling the communication processing unit, an operation mode of the communication processing unit is a first mode or a second mode; and a host reset terminal, wherein the host control unit determines whether the operation mode is the first operation mode or the second operation mode based on a voltage level of the host reset terminal in an internal acknowledgment waiting period, the internal acknowledgment waiting period being a period of waiting for an internal acknowledgment from a storage device control unit after reception of data packets, wherein in the first mode, the communication processing unit moves into a state of waiting for return of an acknowledgment from an m-th storage device, where m is an integer satisfying 1≤m≤n, after transmitting a write command and data to the m-th storage device among the first storage device to the n-th storage device, in the second mode, the communication processing unit moves into a state of transmitting the write command and the data to an (m+1)-th storage device without waiting for the acknowledgment from the m-th storage device after transmitting the write command and the data to the m-th storage device, the m-th storage device includes:

a control unit performing communication processing for communication with the host device;

a storage unit, the data from the host device being written to the storage unit; and a storage control unit controlling access to the storage unit, in the first mode, the control unit indicates the storage control unit to write the data received from the host device to the storage unit when receiving the write command and the data from the host device, and the control unit returns the acknowledgment to the host device after the data is written to the storage unit, and in the second mode, the control unit indicates the storage control unit to write the received data to the storage unit when receiving the write command and the data from the host device, and the control unit does not return the acknowledgment to the host device.

19. The system according to claim 18, wherein in the second mode, the communication processing unit sets the voltage level of the host reset terminal to a logic level for indicating reset after transmitting a data packet to the m-th storage device, the m-th storage device includes a reset terminal, and the control unit determines whether the operation mode is the first operation mode or the second operation mode based on a voltage level of the reset terminal in an internal acknowledgment waiting period, the internal acknowledgment waiting period being a period of waiting for an internal acknowledgment from the storage control unit after reception of data packets.

* * * * *